(12) United States Patent
Kim et al.

(10) Patent No.: US 12,160,955 B2
(45) Date of Patent: Dec. 3, 2024

(54) CIRCUIT BOARD

(71) Applicant: LG INNOTEK CO., LTD., Seoul (KR)

(72) Inventors: Dong Sun Kim, Seoul (KR); Sang Hyuck Nam, Seoul (KR); Sung Wuk Ryu, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 128 days.

(21) Appl. No.: 17/926,294

(22) PCT Filed: May 21, 2021

(86) PCT No.: PCT/KR2021/095047
§ 371 (c)(1),
(2) Date: Nov. 18, 2022

(87) PCT Pub. No.: WO2021/235920
PCT Pub. Date: Nov. 25, 2021

(65) Prior Publication Data
US 2023/0217592 A1    Jul. 6, 2023

(30) Foreign Application Priority Data

May 21, 2020 (KR) .................. 10-2020-0060674

(51) Int. Cl.
H05K 1/11 (2006.01)
H05K 1/03 (2006.01)

(52) U.S. Cl.
CPC .......... H05K 1/115 (2013.01); H05K 1/0366 (2013.01); H05K 2201/09827 (2013.01); H05K 2201/09854 (2013.01)

(58) Field of Classification Search
CPC .......... H05K 1/115; H05K 1/0366; H05K 2201/09827; H05K 2201/09854
See application file for complete search history.

(56) References Cited

U.S. PATENT DOCUMENTS 6,423,934 B2 *  7/2002  Hasegawa ............ H05K 3/0026
                                                     219/121.73
10,440,835 B1 * 10/2019  Grober .................. H01L 21/486
(Continued)

FOREIGN PATENT DOCUMENTS

JP      09-092972       4/1997
JP      2006-319314     11/2006
(Continued)

OTHER PUBLICATIONS

International Search Report dated Sep. 14, 2021 issued in Application No. PCT/KR2021/095047.
(Continued)

*Primary Examiner* — Sherman Ng
(74) *Attorney, Agent, or Firm* — KED & ASSOCIATES, LLP

(57) ABSTRACT

A circuit board according to an embodiment includes an insulating layer including an upper surface and a lower surface, and having a via hole passing through the upper surface and the lower surface in a thickness direction from the upper surface to the lower surface, wherein the via hole includes: a first via part adjacent to the upper surface and having a constant inclination angle along the thickness direction; a second via part adjacent to the lower surface and having a constant inclination angle along the vertical direction; and a third via part disposed between the first via part and the second via part and having an inclination angle different from an inclination angle of the first via part and an inclination angle of the second via part.

16 Claims, 6 Drawing Sheets

(56) References Cited

U.S. PATENT DOCUMENTS

| | | | | |
|---|---|---|---|---|
| 10,531,577 B1* | 1/2020 | Grober | ............... | H05K 3/429 |
| 2010/0163297 A1* | 7/2010 | Kajihara | ............. | H05K 3/0032 |
| | | | | 29/846 |
| 2010/0307807 A1* | 12/2010 | Noda | ................ | H05K 3/0038 |
| | | | | 29/874 |
| 2010/0307809 A1* | 12/2010 | Noda | ................ | H05K 3/4602 |
| | | | | 29/829 |
| 2012/0246925 A1* | 10/2012 | Hibino | ............. | H05K 3/0038 |
| | | | | 427/97.8 |
| 2012/0247818 A1* | 10/2012 | Adachi | .............. | H05K 3/445 |
| | | | | 174/257 |
| 2012/0312591 A1 | 12/2012 | Hwang et al. | | |
| 2014/0154463 A1* | 6/2014 | Liang | ................ | B23K 26/384 |
| | | | | 428/131 |
| 2015/0027758 A1 | 1/2015 | Maeda | | |
| 2018/0342450 A1* | 11/2018 | Huang | ............ | H01L 23/49838 |
| 2020/0253062 A1* | 8/2020 | Zhang | ............... | H05K 1/186 |

FOREIGN PATENT DOCUMENTS

| | | |
|---|---|---|
| JP | 2011-210795 | 10/2011 |
| KR | 10-2011-0045306 | 5/2011 |
| KR | 10-2012-0072635 | 7/2012 |
| KR | 10-2012-0136691 | 12/2012 |
| KR | 10-2014-0147894 | 12/2014 |
| KR | 10-2020-0013471 | 2/2020 |

OTHER PUBLICATIONS

Korean Office Action dated Sep. 26, 2024 issued in Application No. 10-2020-0060674.

\* cited by examiner

【FIG. 1】
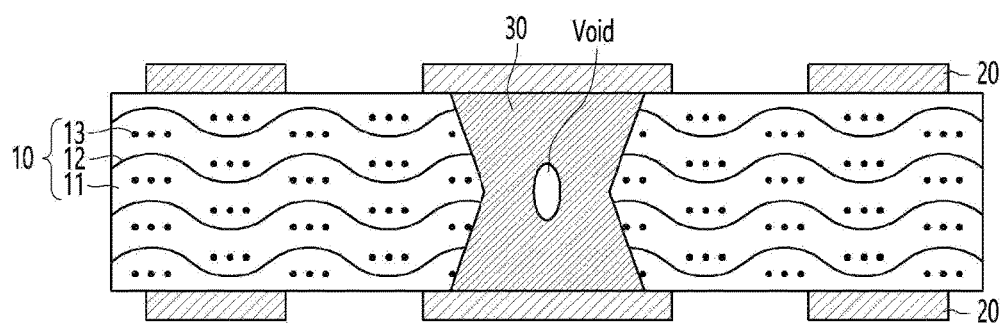
【FIG. 2】
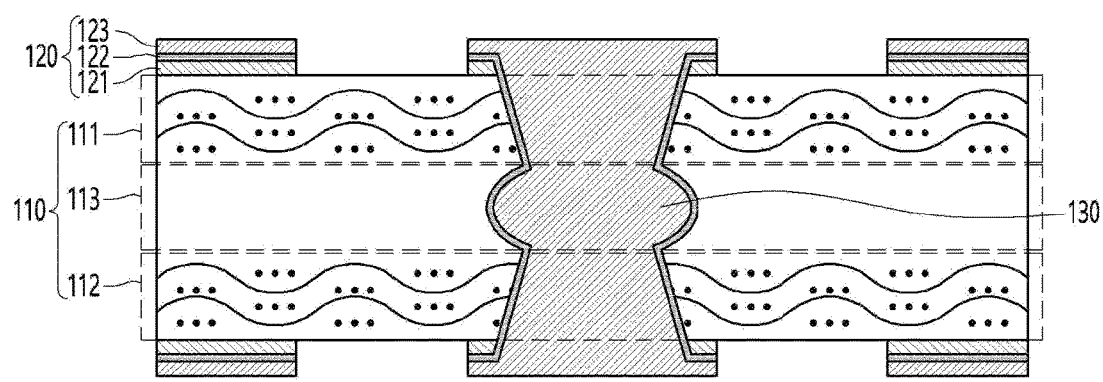

【FIG. 3】
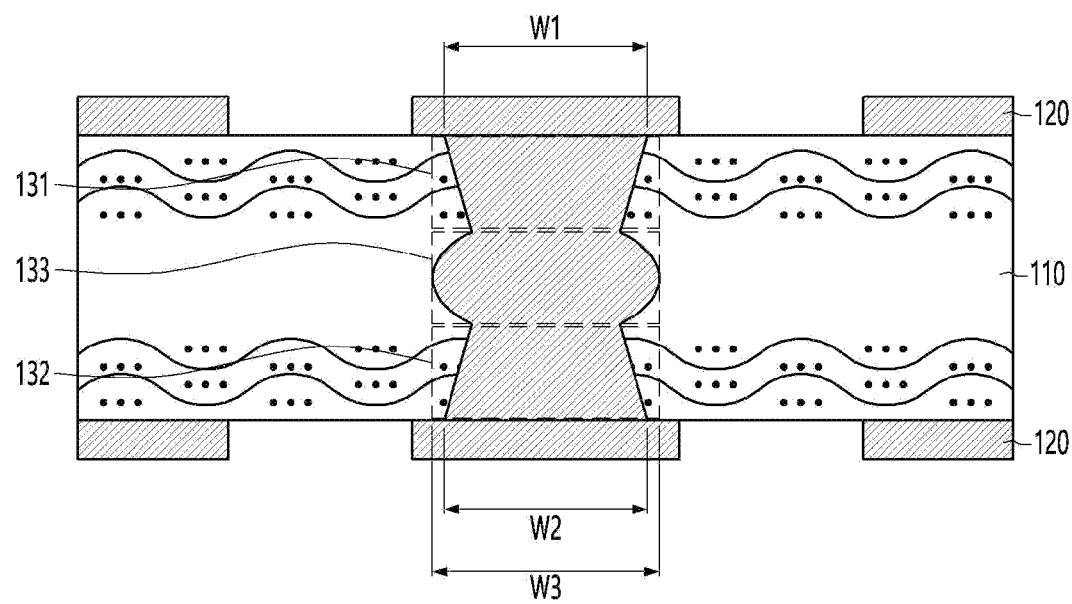
【FIG. 4】
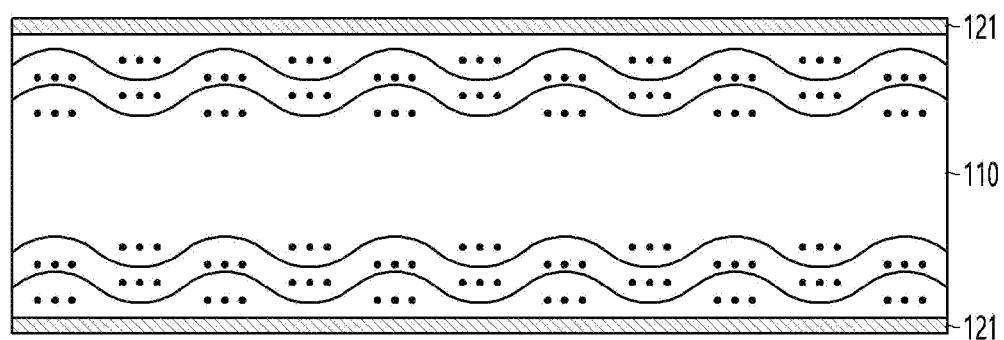

[FIG. 5]
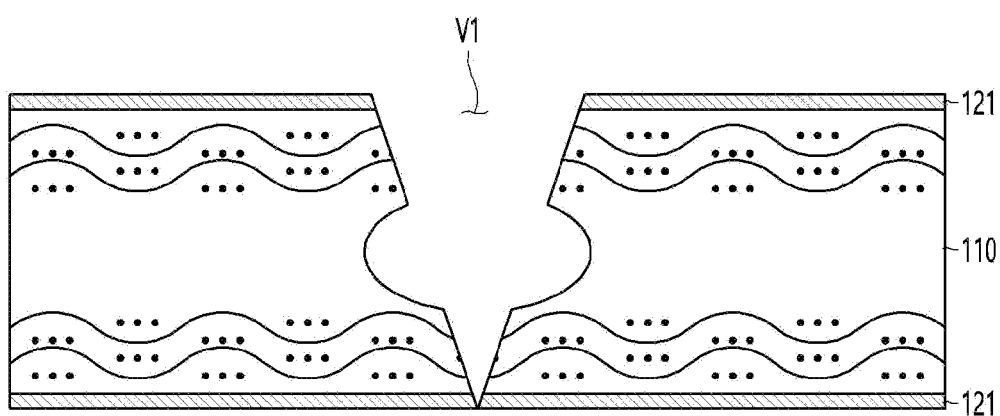
[FIG. 6]
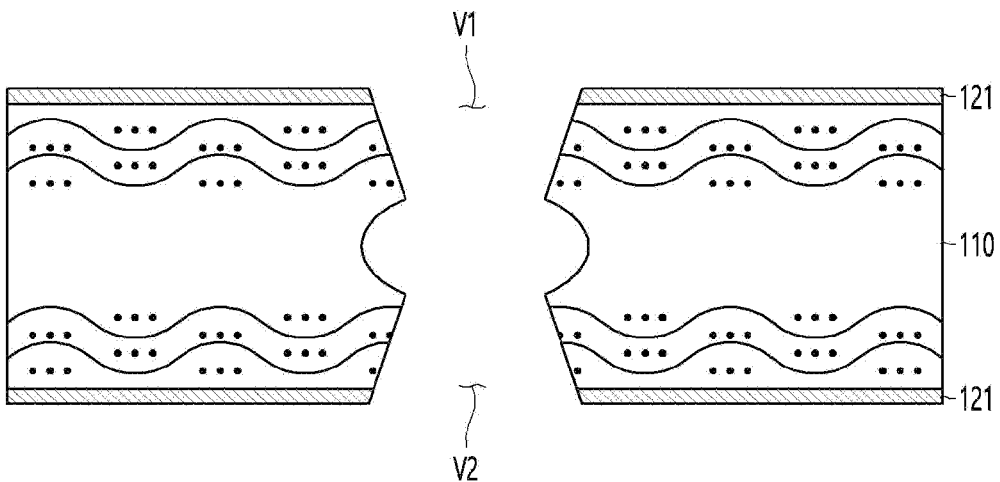

【FIG. 7】
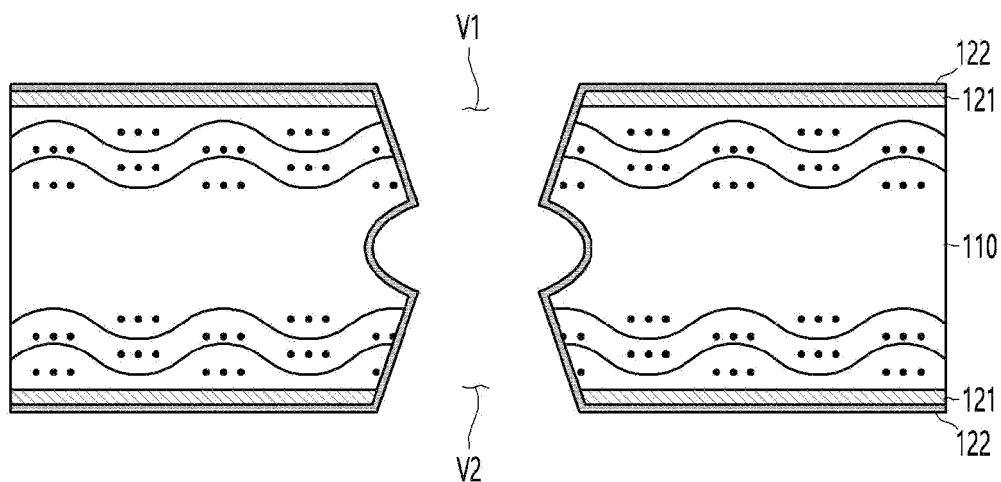
【FIG. 8】
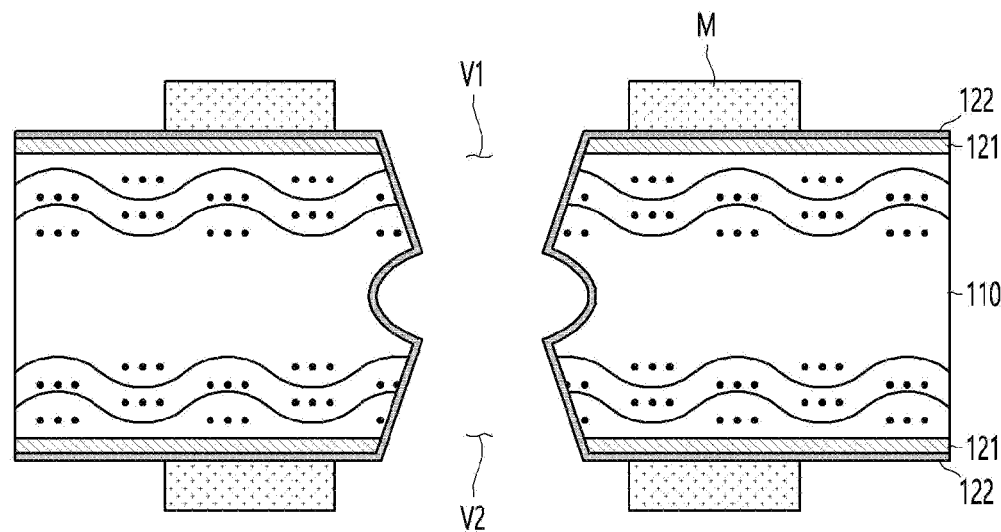

[FIG. 9]
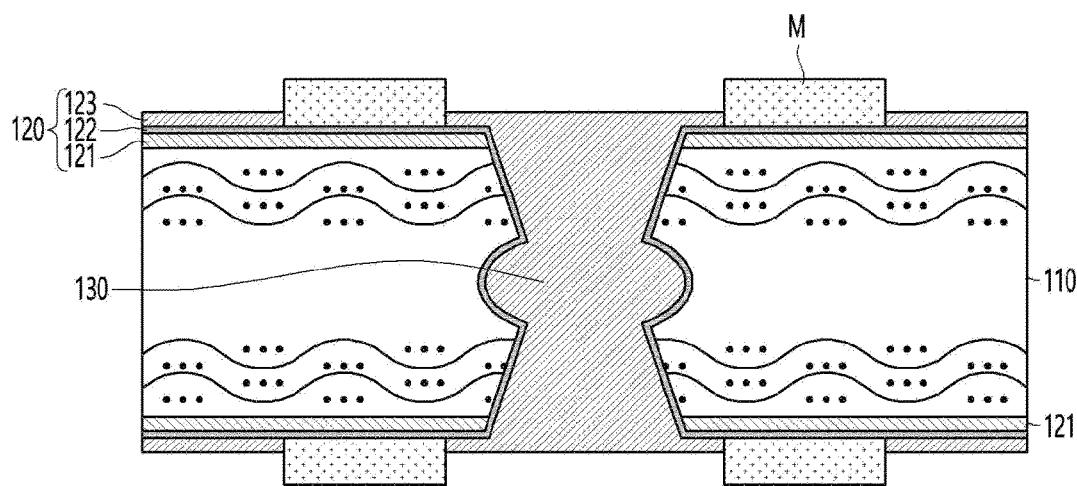
[FIG. 10]
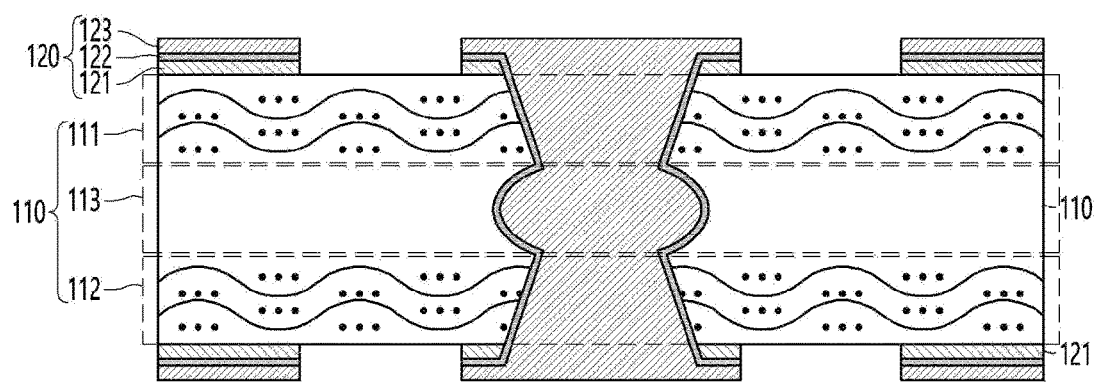

【FIG. 11】
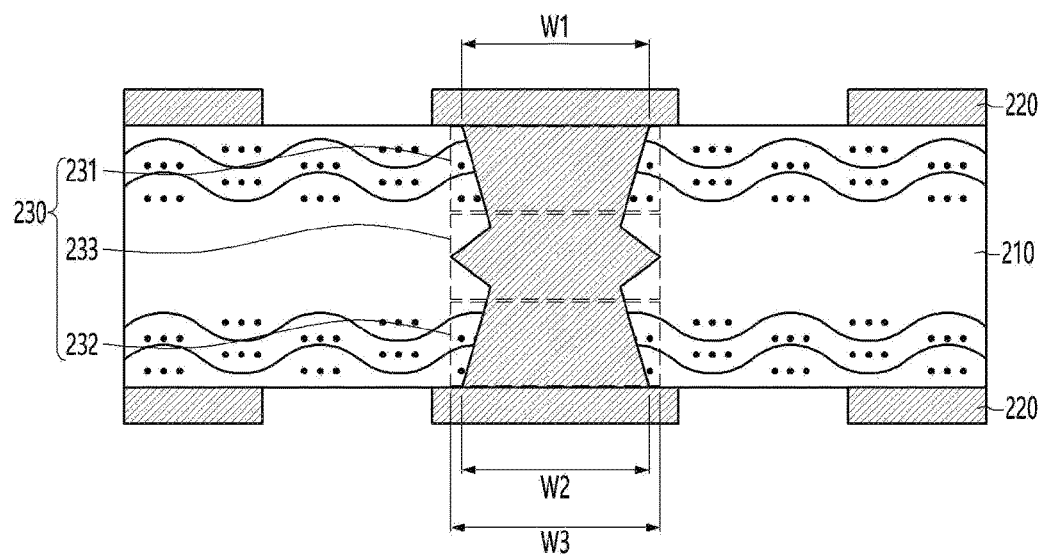
【FIG. 12】
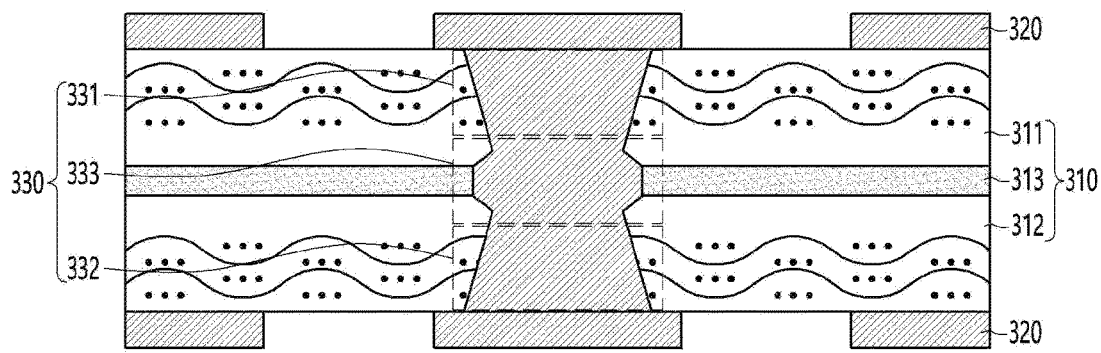

CIRCUIT BOARD

CROSS-REFERENCE TO RELATED PATENT APPLICATIONS

This application is a U.S. National Stage Application under 35 U.S.C. § 371 of PCT Application No. PCT/KR2021/095047, filed May 21, 2021, which claims priority to Korean Patent Application No. 10-2020-0060674, filed May 21, 2020, whose entire disclosures are hereby incorporated by reference.

TECHNICAL FIELD

An embodiment relates to a circuit board.

BACKGROUND ART

A line width of a circuit has been miniaturized as miniaturization, weight reduction, and integration of an electronic component are accelerated. In particular, as a design rule of a semiconductor chip is integrated on a nanometer scale, a circuit line width of a package substrate or a printed circuit board on which the semiconductor chip is mounted has been miniaturized to several micrometers or less.

Various methods have been proposed in order to increase the degree of circuit integration of the printed circuit board, that is, to reduce the circuit line width. For the purpose of preventing loss of the circuit line width in an etching step for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. In the ETS method, instead of forming a copper foil circuit on a surface of the insulating layer, the copper foil circuit is manufactured in an embedded form in the insulating layer, and thus there is no circuit loss due to etching and it is advantageous for miniaturizing the circuit pitch.

Meanwhile, recently, efforts have been made to develop an improved 5G (5th generation) communication system or a pre-5G communication system in order to meet a demand for wireless data traffic. Here, the 5G communication system uses ultra-high frequency (mmWave) bands (sub 6 GHz, 28 GHz, 38 GHz, or higher frequencies) to achieve high data transfer rates.

In addition, integration technologies such as beamforming, massive multi-input multi-output (massive MIMO), and array antennas have been developed in the 5G communication system in order to reduce a path loss of radio waves and increase a transmission distance of radio waves in the ultra-high frequency band. Antenna systems are relatively large given that they can consist of hundreds of active antennas of wavelengths in these frequency bands.

Since such an antenna and AP module are patterned or mounted on the printed circuit board, low loss on the printed circuit board is very important. This means that several substrates constituting the active antenna system, that is, an antenna substrate, an antenna power feeding substrate, a transceiver substrate, and a baseband substrate, should be integrated into one compact unit.

On the other hand, such a circuit board includes vias. The vias perform various functions, for example, signal transmission, heat dissipation, and shielding functions. However, a conventional circuit board has a problem such as a void in forming a via in a raw material of 0.15 T or more.

DISCLOSURE

Technical Problem

The embodiment provides a circuit board including a via having a new structure and a method of manufacturing the same.

In addition, the embodiment provides a circuit board including a via having at least two or more side inflection portions and a method of manufacturing the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment includes an insulating layer including an upper surface and a lower surface, and having a via hole passing through the upper surface and the lower surface in a thickness direction from the upper surface to the lower surface, wherein the via hole includes: a first via part adjacent to the upper surface and having a constant inclination angle along the thickness direction; a second via part adjacent to the lower surface and having a constant inclination angle along the vertical direction; and a third via part disposed between the first via part and the second via part and having an inclination angle different from an inclination angle of the first via part and an inclination angle of the second via part.

In addition, a width of the first via part decreases from the upper surface of the insulating layer toward the lower surface of the insulating layer, and wherein a width of the second via part decreases from the lower surface of the insulating layer toward the upper surface of the insulating layer.

In addition, the first via part includes a first portion adjacent to the third via part and having a smallest width; wherein the second via part includes a second portion adjacent to the third via part and having a smallest width, and wherein a central portion of the third via part in the thickness direction has a width greater than a width of each of the first portion and the second portion.

In addition, the via hole includes a first inflection portion between the first via part and the third via part; a second inflection portion between the second via part and the third via part; and a third inflection portion between the first inflection portion and the second inflection portion; wherein a width of the via hole increases from the first inflection portion toward the third inflection portion, wherein a width of the via hole decreases from the third inflection portion toward the second inflection portion, wherein the third via part includes: a third-first via part whose width increases from the first inflection portion toward the lower surface; and a third-second via part whose width decreases from the second inflection portion toward the upper surface.

In addition, a maximum width of the central portion of the third via part is equal to or greater than a width of the first portion of the first via part or a width of the second portion of the second via part.

In addition, the insulating layer includes: a first region corresponding to the first via part and including glass fibers of a first content; a second region corresponding to the second via part and including glass fibers of a second content; and a third region corresponding to the third via part and including glass fibers having a third content smaller than the first and second content.

In addition, the first and second regions of the insulating layer include a resin impregnated with glass fibers, and wherein the third region of the insulating layer includes only a resin.

In addition, the circuit further includes a circuit pattern disposed on the via hole; and wherein a width of the circuit pattern is greater than a width of the via hole.

In addition, the via hole has a greatest width in the central portion of the third via part.

In addition, a side surface of the third via part has a curved surface.

On the other hand, the circuit board according to the embodiment includes an insulating layer including a first region positioned on an upper portion, a second region positioned on a lower portion, and a third region between the first region and the second region; and a via including a first via part formed in the first region, a second via part formed in the second region, and a third via part formed in the third region and passing through the insulating layer; wherein the via includes a first inflection portion formed between the first via part and the third via part and a second inflection portion formed between the second via part and the third via part, and wherein a width of the via is changed based on the first and second inflection portions.

In addition, a width of the first via part decreases from an upper portion toward the first inflection portion; and wherein a width of the second via part decreases from a lower portion toward the second inflection portion.

In addition, the via includes a third inflection portion formed on a side surface of the third via part between the first and second inflection portions, wherein a width of the third via part increases from the first inflection portion toward the third inflection portion, and decreases from the third inflection portion toward the second inflection portion.

In addition, the first region of the insulating layer contains glass fibers of a first content, the second region of the insulating layer contains glass fibers of a second content, and the third region of the insulating layer contains glass fibers having a third content smaller than the first and second content.

In addition, the first and second regions of the insulating layer include a resin impregnated with glass fibers, and the third region of the insulating layer includes only the resin.

In addition, the insulating layer is composed of a single layer.

In addition, a width of the third via part in the third inflection portion is equal to or greater than a width of an upper surface of the first via part or a width of a lower surface of the second via part.

In addition, a width of an upper surface of the first via part or a width of a lower surface of the second via part is in a range of 70 µm to 150 µm, and a width of the third via part in the third inflection portion is in a range of 70 µm and 200 µm.

In addition, a side surface of the third via part includes a curved surface.

In addition, the third via part has a rhombus shape.

On the other hand, a manufacturing method of the circuit board according to the embodiment includes preparing an insulating layer including a first region positioned on an upper portion, a second region positioned on a lower portion, and a third region between the first region and the second region; forming a primary hole on an upper side of the insulating layer and a secondary hole on a lower side of the insulating layer to form a via hole passing through the insulating layer; and forming a via filling an inside of the via hole; wherein a glass fiber content in the second region of the insulating layer is lower than a glass fiber content in each of the first and second regions; wherein the via includes a first via part formed in the first region, a second via part formed in the second region, and a third via part formed in the third region; wherein a via is formed through the insulating layer; wherein the via includes a first inflection portion formed between the first via part and the third via part, and a second inflection portion formed between the second via part and the third via part; and wherein the via has a shape in which a width is changed based on the first and second inflection portions.

In addition, a width of the first via part decreases from an upper portion toward the first inflection portion, and a width of the second via part decreases from a lower portion toward the second inflection portion.

In addition, the via includes a third inflection portion formed on a side surface of the third via part between the first and second inflection portions, wherein the third via part has a shape in which a width increases from the first inflection portion to the third inflection portion, and a width decreases from the third inflection portion to the second inflection portion.

In addition, the first and second regions of the insulating layer include a resin impregnated with glass fibers, and the third region of the insulating layer includes only resin.

In addition, a width of the third via part in the third inflection part is equal to or greater than a width of an upper surface of the first via part or a width of a lower surface of the second via part.

In addition, a side surface of the third via part includes a curved surface.

In addition, the third via part has a rhombus shape.

Advantageous Effects

According to an embodiment, a via is provided with at least two or more inflection portions on a side surface. Specifically, the via includes a first via part disposed in a first region of the insulating layer, a second via part disposed in a second region of the via, and a third via part disposed in a third region between the first and second regions. In this case, the first via part may have a shape in which the width gradually decreases from an upper surface to a lower surface. In addition, the second via part may have a shape in which a width gradually increases from an upper surface to a lower surface. In addition, the third via part may have a inflection portion between an upper surface and a lower surface. In addition, a width of the third via part may gradually increase from an upper surface toward the inflection portion. In addition, a width of the third via part may gradually decrease from the inflection portion toward a lower surface. According to the via of the embodiment, a width of a central region (third via part) of the via may be greater than or equal to a width of an upper region (first via part) and a lower region (second via part).

Accordingly, the embodiment may solve a plating clogging phenomenon due to the completion of plating in the central region before an upper region or a lower region in a via plating process. In addition, the embodiment can solve the void problem by changing the shape of the via, thereby minimizing the open defect caused by the via crack. In addition, the embodiment provides a via capable of securing reliability even in a high temperature and high humidity environment, thereby improving user satisfaction.

DESCRIPTION OF DRAWINGS

FIG. 1 is a view showing a circuit board according to a comparative example.

FIGS. 2 and 3 are views showing a circuit board according to a first embodiment.

FIGS. 4 to 10 are views showing a manufacturing method of a circuit board shown in FIG. 2 in order of process.

FIG. 11 is a view showing a circuit board according to a second embodiment.

FIG. 12 is a view showing a circuit board according to a third embodiment.

BEST MODE

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

As used herein, the singular forms "a," "an" and "the" are intended to include the plural forms as well, unless the context clearly indicates otherwise.

It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Hereinafter, an embodiment of the present invention will be described in detail with reference to the accompanying drawings.

Before describing the present embodiment, a comparative example compared with the present embodiment will be described.

FIG. 1 is a view showing a circuit board according to a comparative example.

Referring to FIG. 1, a circuit board of a comparative example includes an insulating layer 10, a circuit pattern 20 formed on a surface of the insulating layer, and a via 30 formed in the insulating layer 10.

The insulating layer 10 may be, for example, copper clad laminate (CCL). The insulating layer 10 may include a resin 11, and has a structure in which glass fibers 12 and fillers 13 are impregnated in the resin 11.

A circuit pattern 20 is formed on the surface of the insulating layer 10.

The circuit pattern 20 is disposed on upper and lower surfaces of the insulating layer 10, respectively.

In addition, the via 30 of the circuit board of the comparative example is formed in the insulating layer 10. The via 30 electrically connects a circuit pattern 20 disposed on the upper surface of the insulating layer 10 and a circuit pattern 20 disposed on the lower surface of the insulating layer 10. To this end, the via 30 is formed passing through the insulating layer 10.

The via 30 is formed by forming a via hole passing through the insulating layer 10 and filling the formed via hole with a metal material. For example, the via 30 may be formed through a process of plating an inside of the via hole with a metal material.

At this time, the insulating layer 10 has a thickness of 0.15 T or more.

Also, when the insulating layer 10 has a thickness of 0.15 T or more, it may be difficult to form a via hole in the insulating layer 10 in one process.

Accordingly, the comparative example forms a final via hole by performing a via hole processing process on an upper side of the insulating layer 10 and once again performing a via hole processing process on a lower side of the insulating layer 10. Accordingly, the via hole in the comparative example has an hourglass shape. Also, the via 30 has an hourglass shape corresponding to the shape of the via hole.

As described above, the via hole in the comparative example has a shape in which a width of a central portion is narrow compared to an upper portion or a lower portion. Accordingly, if plating is clogged as plating proceeds first in the central portion in the process of plating a metal material inside the via hole, a void problem such as an empty space where plating is not performed may occur inside the via.

In addition, an empty space such as a void may exist inside the via as described above. In addition, the via including the void may have a crack due to stress due to low physical rigidity, and finally, when exposed to a high temperature or high humidity environment, there is a problem that an open defect due to a via crack occurs.

Accordingly, the embodiment provides a circuit board having a new structure that solves the void problem in the comparative example as described above.

Hereinafter, a circuit board according to an embodiment will be described in detail.

FIGS. 2 and 3 are views showing a circuit board according to a first embodiment.

Referring to FIGS. 2 and 3, a circuit board includes an insulating layer 110, a circuit pattern 120, and a via 130.

First, although the circuit board is illustrated as having a one-layer structure based on the insulating layer in FIGS. 2 and 3, the embodiment is not limited thereto. For example, at least one insulating layer may be additionally stacked on upper and lower surfaces of the insulating layer 110 shown in FIGS. 2 and 3, respectively, and accordingly, the circuit board may have a multi-layered structure. However, the embodiment shows only a specific insulating layer 110 disposed inside the circuit board having a multilayer structure.

The insulating layer 110 may have a flat plate structure.

The insulating layer 110 may constitute one layer of a printed circuit board (PCB). Here, the insulating layer 110 may be implemented as a multilayer substrate in which a plurality of insulating layers are successively stacked as described above.

In addition, a circuit pattern 120 may be disposed on a surface of the insulating layer 110. For example, a circuit pattern 120 may be disposed on each of the upper and lower surfaces of the insulating layer 110. In this case, the circuit pattern may include a via pad connected to a via, a connection pad connected to an external substrate, a mounting pad on which an electronic component is mounted, and a trace serving as a signal transmission line between the pads.

The insulating layer 110 is a substrate on which an electric circuit capable of changing wiring is formed, and may include all of a printed circuit board and an insulating substrate made of an insulating material capable of forming a circuit pattern on the surface of the insulating layer.

The insulating layer 110 may include a prepreg including glass fibers. In detail, the insulating layer 110 may include an epoxy resin and a material in which glass fibers and fillers are dispersed in the epoxy resin. For example, the insulating layer 110 may be formed of copper clad laminate (CCL).

In addition, the insulating layer 110 may include a resin and have a structure in which glass fibers and fillers are dispersed in the resin.

The glass fiber has a very low coefficient of thermal expansion and a very high modulus, thus playing a very important role in increasing a strength of a circuit board. Accordingly, an insulating layer impregnated with glass fibers is used for an innermost layer of a general circuit board. Here, the glass fiber impregnated in the insulating layer 110 in the embodiment may include E-glass, D-glass, T-glass, or NE-glass. In particular, a dielectric loss factor of D-glass or NE-glass is lower than that of E-glass or T-glass. Therefore, when glass fibers such as D-glass or NE-glass are impregnated in the insulating layer 110 in the embodiment, it is possible to dramatically lower the coefficient of thermal expansion, improve the insulating properties essential for the insulating layer, and prevent unnecessary power loss.

Meanwhile, the insulating layer 110 in the embodiment may have different material properties for each region. For example, glass fibers and fillers may be impregnated in a specific region of the insulating layer 110. In addition, glass fibers and fillers may not be included in regions other than the specific region of the insulating layer 110. For example, the other region of the insulating layer 110 may include only resin, but is not limited thereto. Preferably, the other region in the embodiment may contain a lower content of glass fibers than the specific region.

However, the insulating layer 110 of the embodiment may be divided into a plurality of regions in a vertical direction, and internal material structures in the plurality of regions may be different from each other.

For example, the insulating layer 110 may include a first region 111, a second region 112, and a third region 113. That is, the insulating layer 110 is a single layer, and the single layer may be divided into three regions.

The first region 111 of the insulating layer 110 may be an upper region.

The second region 112 of the insulating layer 110 may be a lower region.

The third region 113 of the insulating layer 110 may be a region between the first region 111 and the second region 112. Preferably, the third region 113 of the insulating layer 110 may be a central region.

In this case, a content of glass fibers included in at least one of the first region 111, the second region 112, and the third region 113 of the insulating layer 110 of the embodiment may be lower than a content of glass fibers contained in other regions.

For example, the first region 111 and the second region 112 of the insulating layer 110 of the embodiment may be impregnated with glass fibers and fillers in a resin to improve the strength of the circuit board. Alternatively, the third region 113 of the insulating layer 110 may be formed of only resin, but is not limited thereto. That is, the third region 113 of the insulating layer 110 in the embodiment may be composed of only resin, but may also contain a certain content of glass fibers. However, when glass fibers are included in the third region 113 of the insulating layer 110 in the embodiment, a glass fiber content in the third region 113 may be smaller than a glass fiber content in the first region 111 or a glass fiber content in the second region 112.

That is, the embodiment includes the insulating layer 110 of copper clad laminate (CCL). The insulating layer 110 may mean a single layer. That is, the circuit pattern 120 may be disposed on upper and lower surfaces of the insulating layer 110. In addition, the circuit pattern 120 may not be disposed in an inner region except for the upper and lower surfaces of the insulating layer 110.

And, when manufacturing CCL (Copper Clad Laminate) used as the insulating layer 110, the embodiment allows the glass fiber content in the third region 113 of a central portion to be smaller than the glass fiber content in the first region 111 of an upper portion and the second region 112 of a lower portion.

Meanwhile, the glass fiber content in the first region 111 of the insulating layer 110 is set to be the same as the glass fiber content in the second region 112. For example, when the glass fiber content in the first region 111 of the insulating layer 110 and the glass fiber content in the second region 112 are different from each other, warpage may occur in the manufacturing process of the circuit board, and, which may cause reliability problems. Accordingly, the glass fiber content in the first region 111 of the insulating layer 110 and the glass fiber content in the second region 112 of the insulating layer 110 may be the same as each other, and accordingly, the warpage problem can be solved.

In addition, when manufacturing CCL (Copper Clad Laminate) used as the insulating layer 110 in another embodiment, the embodiment allows the glass fiber and filler to be impregnated in the first region 111 of an upper portion and the second region 112 of a lower portion. In addition, glass fibers and fillers are not present in the third region 113 of the insulating layer 110 in the embodiment. For example, the third region 113 of the insulating layer 110 in the embodiment may include only resin.

In the embodiment, the glass fiber is impregnated only in a specific region of the insulating layer 110 as described above. In addition, as described above, the glass fiber content in the third region 113 of a central portion of the insulating layer 110 is smaller than the glass fiber content in the first region 111 of an upper portion and the second region 112 of a lower portion. In this case, when a via hole passing through the insulating layer 110 is formed, a size of a via hole in the third region 113 of the insulating layer 110 may be larger than a size of a via hole in the first region 111 and/or the second region 112 by not including glass fibers in the third region 113 of the insulating layer 110.

In addition, the embodiment may provide the via 130 having a shape different from that of the comparative example by the structure of the insulating layer 110 as described above. For example, the via 130 of the embodiment may have a shape in which the width increases by including a inflection portion in the third region 113, thereby solving the void problem. This will be described in detail below.

Meanwhile, the insulating layer 110 may have a thickness of 100 μm to 500 μm. For example, the insulating layer 110 may have a thickness between 120 μm and 400 μm. For example, the insulating layer 110 may have a thickness of 150 μm to 250 μm. When the thickness of the insulating layer 110 is less than 100 μm, a warpage characteristic of the circuit board may be deteriorated. When the thickness of the insulating layer 110 exceeds 500 μm, an overall thickness of the circuit board may increase.

A circuit patterns 120 is respectively disposed on upper and lower surfaces of the insulating layer 110.

The circuit pattern 120 may include a via pad connected to a via, a connection pad connected to an external substrate, a mounting pad on which an electronic component is mounted, and a trace serving as a signal transmission line between the pads.

In an embodiment, the circuit pattern 120 may have a plurality of layer structures. For example, the circuit pattern 120 may have a three-layer structure.

Specifically, the circuit pattern 120 may include a metal layer 121 disposed on the insulating layer 110. The metal layer 121 may be a part of a copper clad laminate (CCL). For example, the metal layer 121 may be a copper foil layer disposed on the insulating layer 110 constituting a copper clad laminate (CCL).

The circuit pattern 120 may include a first plating layer 122 disposed on the metal layer 121. The first plating layer 122 may be a metal seed layer.

The circuit pattern 120 may include a second plating layer 123 disposed on the first plating layer 122. The second plating layer 123 may be a plating layer plated using the first plating layer 122 as a seed layer so that the circuit pattern 120 may have a predetermined thickness.

However, although it has been described that the circuit pattern 120 has a three-layer structure in the drawings, the embodiment is not limited thereto. For example, the circuit pattern 120 may have a two-layer structure according to a manufacturing method. For example, when manufacturing the circuit pattern 120, a process of forming the first plating layer 122 may be performed after the metal layer 121 is removed. In this case, the circuit pattern 120 may have a two-layer structure.

The circuit pattern 120 may be formed of at least one metal material selected from gold (Au), silver (Ag), platinum (Pt), titanium (Ti), tin (Sn), copper (Cu), and zinc (Zn).

In addition, the circuit pattern 120 may be formed of a paste or solder paste including at least one metal material selected from gold (Au), silver (Ag), platinum (Pt), titanium (Ti), tin (Sn), copper (Cu), and zinc (Zn) having excellent bonding power. Preferably, the inner layer circuit pattern 120, the first outer layer circuit pattern 130, and the second outer layer circuit pattern 140 may be formed of copper (Cu) having high electrical conductivity and a relatively inexpensive price.

The circuit pattern 120 may be formed by an additive process, a subtractive process, a modified semi additive process (MSAP), and a semi additive process (SAP) process, which are typical circuit board manufacturing processes. and a detailed description thereof will be omitted here.

The via 130 may be disposed in the insulating layer 110.

For example, the via 130 may be formed to pass through the insulating layer 110.

For example, one end of the via 130 may directly contact a circuit pattern formed on an upper surface of the insulating layer 110. For example, the other end of the via 130 may directly contact a circuit pattern formed on a lower surface of the insulating layer 110. Accordingly, the via 130 may electrically connect the circuit pattern disposed on the upper surface of the insulating layer 110 and the circuit pattern disposed on the lower surface of the insulating layer 110.

The via 130 may be divided into a plurality of parts.

For example, the via 130 may include a first via part 131 formed in the first region 111 of the insulating layer 110, a second via part 132 formed in the second region 112 of the insulating layer 110, and a third via part 133 formed in the third region 113 of the insulating layer 110.

The first via part 131 of the via 130 may have a first shape. For example, the first via part 131 of the via 130 may have a shape in which a width gradually decreases from an upper surface to a lower surface. For example, the first via part 131 of the via 130 may have a trapezoidal shape in which a width of an upper surface is greater than a width of a lower surface.

The second via part 132 of the via 130 may have a second shape. For example, the second via part 132 of the via 130 may have a shape in which a width gradually increases from an upper surface to a lower surface. For example, the second via part 132 of the via 130 may have a trapezoidal shape in which a width of an upper surface is smaller than a width of a lower surface. For example, the first via part 131 and the second via part 132 may have mutually symmetrical shapes.

The third via part 133 of the via 130 may have a third shape. For example, the third via part 133 of the via 130 may include a inflection portion on a side surface thereof. For example, the third via part 133 of the via 130 may have a shape in which a width gradually increases from an upper surface to the inflection portion. For example, the third via part 133 of the via 130 may have a shape in which a width gradually decreases from the inflection portion toward a lower surface. For example, the third via part 133 of the via 130 may have a shape in which a width gradually increases and then decreases based on the inflection portion. In this case, a side surface of the third via part 133 of the via 130 in the first embodiment may include a curved surface. Accordingly, a side surface of the third via part 133 of the via 130 in the first embodiment may include a first portion having a first curvature and a second portion having a second curvature different from the first curvature based on the inflection portion. For example, the third via part 133 of the via 130 may have an elliptical shape that gradually increases and then decreases in width based on the inflection portion. That is, the via 130 of the embodiment, the via 130 includes the third via part 133 having a largest width in a central portion. Accordingly, the embodiment can solve the void problem that occurs when plating is first completed in the third via part 133 that is the central portion of the via 130 in the plating process of filling the via 130.

In addition, the third via part 133 may include a inflection portion and a second inflection portion. In addition, the third via part 133 may include a third-first via part whose width increases from the first inflection portion toward a lower portion and a third-second via part whose width decreases from the second inflection portion toward an upper portion. In this case, a maximum width of the third via part may be equal to or greater than a width of an upper surface of the first via part or a width of a lower surface of the second via part.

The via 130 may be formed by filling an inside of a via hole (not shown) penetrating the insulating layer 110 with a conductive material. For example, the inside of the via hole may be formed through a plating process.

The via hole may be formed by any one of mechanical, laser, and chemical processing. When the through hole is formed by machining, methods such as milling, drilling, and routing may be used, and when formed by laser processing, a UV or CO2 laser method may be used. In addition, when formed by chemical processing, a chemical containing aminosilane, ketones, or the like may be used. Accordingly, the insulating layer 110 may be opened.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has a wide range of possible thicknesses.

As the laser processing drill, it is preferable to use a YAG (Yttrium Aluminum Garnet) laser, a CO2 laser, or an ultraviolet (UV) laser. YAG laser is a laser that can process both copper foil layers and insulating layers, and CO2 laser is a laser that can process only insulating layers.

When the via hole is formed, a first plating layer 122 may be formed by filling the inside of the via hole with a conductive material. Further, when the first plating layer 122 is formed, the via 130 may be formed by filling the inside of the via hole with a conductive material using the first plating layer 122 as a seed layer.

The metal material forming the via 130 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, inkjetting and dispensing.

Hereinafter, the via 130 according to the embodiment will be described in detail.

As described above, the via 130 may include a first via part 131 formed in the first region 111 of the insulating layer 110, a second via part 132 formed in the second region 112 of the insulating layer 110, and a third via part 133 formed in the third region 113 of the insulating layer 110.

The first via part 131 and the second via part 132 may have a symmetrical shape or the same shape as described above.

That is, the first via part 131 and the second via part 132 are respectively formed in the first region 111 and the second region 112 of the insulating layer 110. In this case, a content of glass fibers included in the first region 111 of the insulating layer 110 is substantially the same as a content of glass fibers included in the second region 112 of the insulating layer 110. Accordingly, the first via part 131 and the second via part 132 may have substantially the same shape. However, the first via part 131 is positioned on an upper portion of the insulating layer 110, and the second via part 132 is positioned on a lower portion of the insulating layer 110. Accordingly, the first via part 131 and the second via part 132 have a symmetrical shape or an inverted shape.

However, the third via part 133 is formed in the third region 113 of the insulating layer 110. In this case, the third region 113 of the insulating layer 110 may not be impregnated with glass fibers and may be formed of only resin. Alternatively, a glass fiber content in the third region 113 of the insulating layer 110 may be smaller than a glass fiber content in the first region 111 or a second region 112 of the insulating layer 110.

Accordingly, the via 130 in the embodiment may have a first inflection portion at an interface between the first via part 131 and the third via part 133. That is, a width of the via 130 gradually decreases from an upper surface of the first via part 131 to an upper surface of the third via part 133. In addition, a width change occurs in the via 130 at the first inflection portion. For example, a width of the via 130 may increase again at the first inflection portion. For example, the via 130 may have a shape in which a width decreases from an upper surface to the first inflection portion, and has a shape in which a width increases again at the second inflection portion.

Also, the via 130 may have a second inflection portion at an interface between the second via part 132 and the third via part 133. That is, a width of the via 130 gradually decreases from a lower surface of the second via part 132 to a lower surface of the third via part 133. In addition, a width change occurs in the via 130 at the second inflection portion. For example, a width of the via 130 may increase again at the second inflection portion. For example, the via 130 may have a shape in which a width decreases from a lower surface to the second inflection portion, and then increases in a width again at the second inflection portion.

As described above, the via 130 in the embodiment has at least two inflection portions. This can achieve the effect of solving a plating defect that occurs as a width decreases in a central portion of the via 130.

Meanwhile, a third inflection portion may be formed on a side surface of the third via part 133 of the via 130 in the embodiment.

That is, the third via part 133 of the via 130 may have a shape in which a width gradually increases from the first inflection portion to the third inflection portion. Also, the third via part 133 of the via 130 may have a shape in which a width gradually decreases from the third inflection portion to the second inflection portion.

And, a side surface of the third via part 133 in the embodiment may be a curved surface. Accordingly, the side surface of the third via part 133 of the via 130 in the first embodiment may include a first portion having a first curvature and a second portion having a second curvature different from the first curvature based on the third inflection portion. For example, the third via part 133 of the via 130 may have an elliptical shape that gradually increases and then decreases in width based on the third inflection portion.

Meanwhile, an upper surface of the via 130 of the embodiment may have a first width W1. In this case, the upper surface of the via 130 may correspond to an upper surface of the first via part 131. The first width W1 of the upper surface of the via 130 may be 70 μm to 150 μm. For example, the first width W1 of the upper surface of the via 130 may be 80 μm to 130 μm. For example, the first width W1 of the upper surface of the via 130 may be 90 μm to 120 μm.

Meanwhile, a lower surface of the via 130 of the embodiment may have a second width W2. In this case, a lower surface of the via 130 may correspond to a lower surface of the second via part 132. The second width W2 of the lower surface of the via 130 may be 70 μm to 150 μm. For example, the second width W2 of the lower surface of the via 130 may be 80 μm to 130 μm. For example, the second width W2 of the lower surface of the via 130 may be 90 μm to 120 μm.

That is, the upper and lower surfaces of the via 130 in the embodiment may have the same width. For example, the first width W1 may be the same as the second width W2.

Meanwhile, a central portion of the via 130 of the embodiment may have a third width W3. In this case, the width of the central portion of the via 130 may mean a width at a position where the third inflection portion of the third via part 133 is formed.

The third width W3 of the central portion of the via 130 may be equal to or greater than the first width W1 and the second width W2. For example, the third width W3 of the central portion of the via 130 may be 70 μm to 200 μm. For example, the third width W3 of the central portion of the via 130 may be 80 μm to 180 μm. For example, the third width W3 of the central portion of the via 130 may be 90 μm to 170 μm.

As described above, the third width W3 of the central portion of the via 130 of the embodiment is equal to or greater than the width of the upper surface or the width of the lower surface of the via 130. Accordingly, the embodiment can solve a void problem that may occur in the process of forming the via 130, thereby improving reliability.

According to an embodiment, a via is provided with at least two or more inflection portions on a side surface. Specifically, the via includes a first via part disposed in a first region of the insulating layer, a second via part disposed in a second region of the via, and a third via part disposed in a third region between the first and second regions. In this case, the first via part may have a shape in which the width gradually decreases from an upper surface to a lower surface. In addition, the second via part may have a shape in which a width gradually increases from an upper surface to a lower surface. In addition, the third via part may have a inflection portion between an upper surface and a lower surface. In addition, a width of the third via part may gradually increase from an upper surface toward the inflection portion. In addition, a width of the third via part may gradually decrease from the inflection portion toward a lower surface. According to the via of the embodiment, a width of a central region (third via part) of the via may be greater than or equal to a width of an upper region (first via part) and a lower region (second via part).

Accordingly, the embodiment may solve a plating clogging phenomenon due to the completion of plating in the central region before an upper region or a lower region in a via plating process. In addition, the embodiment can solve the void problem by changing the shape of the via, thereby minimizing the open defect caused by the via crack. In addition, the embodiment provides a via capable of securing reliability even in a high temperature and high humidity environment, thereby improving user satisfaction.

Hereinafter, a manufacturing process of the circuit board shown in FIGS. 2 and 3 will be described.

FIGS. 4 to 10 are views showing a manufacturing method of a circuit board shown in FIG. 2 in order of process.

Referring to FIG. 4, an insulating layer 110 that is a basis for manufacturing a circuit board is prepared. The insulating layer 110 may have a flat plate structure.

The insulating layer 110 may constitute one layer of a printed circuit board (PCB). Here, the insulating layer 110 may be implemented as a multilayer substrate in which a plurality of insulating layers are successively stacked as described above.

The insulating layer 110 may include a prepreg including glass fibers. In detail, the insulating layer 110 may include an epoxy resin and a material in which glass fibers and fillers are dispersed in the epoxy resin. For example, the insulating layer 110 may be formed of copper clad laminate (CCL).

Accordingly, a metal layer 121 may be formed on an upper surface and a lower surface of the insulating layer 110, respectively.

In this case, the insulating layer 110 may include a resin and have a structure in which glass fibers and fillers are dispersed in the resin.

Meanwhile, the insulating layer 110 in the embodiment may have different material properties for each region. For example, glass fibers and fillers may be impregnated in a specific region of the insulating layer 110. In addition, glass fibers and fillers may not be included in regions other than the specific region of the insulating layer 110. For example, the other region of the insulating layer 110 may include only resin, but is not limited thereto. Preferably, the other region in the embodiment may contain a lower content of glass fibers than the specific region.

Next, referring to FIG. 5, a process of forming the first via hole V1 may be performed on the CCL including the prepared insulating layer 110 and the metal layer 121.

The first via hole V1 is formed by laser processing on an upper side of the insulating layer 110. Accordingly, a width of the first via hole V1 gradually decreases from an upper region to a lower region of the insulating layer 110.

In this case, the insulating layer 110 has a different glass fiber content for each region. That is, a glass fiber content of the third region 113 of the insulating layer 110 is smaller than a glass fiber content of the first region 111. Accordingly, a width of the first via hole V1 gradually decreases from an upper portion to a lower portion in the first region 111. In addition, the first via hole V1 is also formed in the second region 112 of the insulating layer 110. In this case, the first via hole V1 has a first inflection portion at an interface between the first region 111 and the third region 113 of the insulating layer 110 and a width change occurs. That is, the third region 113 of the insulating layer 110 has a small glass fiber content, and accordingly, the first via hole V1 may have a shape in which a width increases from the first inflection portion toward a lower portion.

Next, referring to FIG. 6, a process of forming the second via hole V2 on a lower side of the CCL including the prepared insulating layer 110 and the metal layer 121 may be performed.

In this case, the second via hole V2 may have a different shape for each region. In this case, the insulating layer 110 has a predetermined thickness. Therefore, the via hole passing through the insulating layer 110 in the embodiment cannot be completely formed by a one-time process. Accordingly, the embodiment proceeds with a process of forming a via hole on the upper side and the lower side of the insulating layer 110, respectively.

Meanwhile, the second via hole V2 is formed by laser processing on a lower side of the insulating layer 110. Accordingly, a width of the second via hole V2 gradually decreases from a lower region to an upper region of the insulating layer 110.

In this case, the insulating layer 110 has a different glass fiber content for each region. That is, the third region 113 of the insulating layer 110 has a lower glass fiber content than the second region 112. Accordingly, a width of the second via hole V2 gradually decreases from a lower portion to an upper portion in the second region 112. In addition, the second via hole V2 is also formed in the second region 112 of the insulating layer 110. In this case, the second via hole V2 has a second inflection portion at an interface between the second region 112 and the third region 113 of the insulating layer 110 and a width change occurs. That is, the third region 113 of the insulating layer 110 has a small glass fiber content, and accordingly, the second via hole V2 may have a shape in which a width increases again from the second inflection portion to an upper portion.

On the other hand, the via hole in the embodiment has a shape by a combination of the first via hole (V1) and the second via hole (V2) formed by respectively proceeding from the upper side and the lower side of the insulating layer 110. The first via hole V1 and the second via hole V2 are formed in the third region 113 of the insulating layer 110, and accordingly, the via hole has a largest width at a center of the third region 113.

A final via hole formed by the combination of the first via hole V1 and the second via hole V2 may have a third inflection portion at a center of the third region 113 of the insulating layer 110. In other words, the final via hole in the embodiment has first to third inflection portions. That is, an inner wall of the final via hole in the embodiment may have three points at which a slope or a curvature changes.

Next, referring to FIG. 7, a process of forming a first plating layer 122 on a surface of the metal layer 121 and an inner wall of the formed via hole may be performed.

The first plating layer 122 may be formed through a chemical copper plating process, but is not limited thereto.

Next, referring to FIG. 8, a process of forming a mask M on the first plating layer 122 may be performed. The mask M may have an opening exposing a part of an upper surface of the first plating layer 122. Also, the mask M may have an opening exposing the formed via hole.

Next, referring to FIG. 9, a process of forming a second plating layer 123 by plating the region exposed through the opening of the mask M may be performed. In this case, a portion of the second plating layer 123 disposed inside the via hole constitutes the via 130, and the other portion of the second plating layer 123 formed on the first plating layer 122 constitutes the circuit pattern 120.

Next, as shown in FIG. 10, a process of removing the mask M and partially removing the metal layer 121 and the first plating layer 122 may be performed.

As described above, a third width W3 of a central portion of the via 130 in the embodiment is equal to or greater than a width of an upper surface or a width of a lower surface of the via 130. Accordingly, the embodiment can solve a void problem that may occur in the process of forming the via 130, thereby improving reliability.

According to an embodiment, a via is provided with at least two or more inflection portions on a side surface. Specifically, the via includes a first via part disposed in a first region of the insulating layer, a second via part disposed in a second region of the via, and a third via part disposed in a third region between the first and second regions. In this case, the first via part may have a shape in which the width gradually decreases from an upper surface to a lower surface. In addition, the second via part may have a shape in which a width gradually increases from an upper surface to a lower surface. In addition, the third via part may have a inflection portion between an upper surface and a lower surface. In addition, a width of the third via part may gradually increase from an upper surface toward the inflection portion. In addition, a width of the third via part may gradually decrease from the inflection portion toward a lower surface. According to the via of the embodiment, a width of a central region (third via part) of the via may be greater than or equal to a width of an upper region (first via part) and a lower region (second via part).

Accordingly, the embodiment may solve a plating clogging phenomenon due to the completion of plating in the central region before an upper region or a lower region in a via plating process. In addition, the embodiment can solve the void problem by changing the shape of the via, thereby minimizing the open defect caused by the via crack. In addition, the embodiment provides a via capable of securing reliability even in a high temperature and high humidity environment, thereby improving user satisfaction.

FIG. 11 is a view showing a circuit board according to a second embodiment.

Referring to FIG. 11, the circuit board includes an insulating layer 210, a circuit pattern 220, and a via 230.

An insulating layer 210 and a circuit pattern 220 are substantially the same as the corresponding configuration of the circuit board in the first embodiment described with reference to FIGS. 2 and 3, and thus a detailed description thereof will be omitted.

In the second embodiment, the via 230 includes a first via part 231 formed in a first region 211 of the insulating layer 210, a second via part 231 formed in a second region 212 of the insulating layer 210, and a third via part 233 formed in a third region 213 of the insulating layer 210.

The first via part 231 and the second via part 232 may have a symmetrical shape or the same shape.

That is, the first via part 231 and the second via part 232 are respectively formed in the first region and the second region of the insulating layer 210. As described in the first embodiment, the insulating layer 210 is divided into a plurality of regions, and the glass fiber content in the plurality of regions may be different from each other.

Accordingly, the via 230 in the embodiment may have a first inflection portion at an interface between the first via part 231 and the third via part 233. That is, ae width of the via 230 gradually decreases from an upper surface of the first via part 231 to an upper surface of the third via part 233. In addition, a width change occurs in the via 230 at the first inflection portion. For example, a width of the via 230 may increase again at the first inflection portion. For example, the via 230 may have a shape in which a width decreases from an upper surface to the first inflection portion, and then increases in width again at the second inflection portion.

Also, the via 230 may have a second inflection portion at an interface between the second via part 232 and the third via part 233. That is, a width of the via 230 gradually decreases from a lower surface of the second via part 232 to a lower surface of the third via part 233. In addition, a width change occurs in the via 230 at the second inflection portion. For example, a width of the via 230 may increase again at the second inflection portion. For example, the via 230 may have a shape in which a width decreases from a lower surface to the second inflection portion, and then increases in width again at the second inflection portion.

As described above, the via 230 in the embodiment has at least two inflection portions. This can achieve the effect of solving plating defects that occur as the width decreases in the central portion of the via 230.

Meanwhile, a third inflection portion may be formed on a side surface of the third via part 233 of the via 230 in the embodiment.

That is, the third via part 233 of the via 230 may have a shape in which a width gradually increases from the first inflection portion to the third inflection portion. Also, the third via part 233 of the via 230 may have a shape in which a width gradually decreases from the third inflection portion to the second inflection portion.

And, a side surface of the third via part 133 in the embodiment may be a straight line. Accordingly, a side surface of the third via part 233 of the via 230 in the second embodiment may have a first portion having a first inclination and a second portion having a second inclination different from the first inclination based on the third inflection portion. For example, the third via part 233 of the via 230 may have a rhombus shape that gradually increases and then decreases in width based on the third inflection portion.

Meanwhile, an upper surface of the via 230 may have a first width W1. In this case, the upper surface of the via 230 may correspond to an upper surface of the first via part 231. The first width W1 of the upper surface of the via 230 may be 70 μm to 150 μm. For example, the first width W1 of the upper surface of the via 230 may be 80 μm to 130 μm. For example, the first width W1 of the upper surface of the via 230 may be 90 μm to 120 μm.

Meanwhile, a lower surface of the via 230 may have a second width W2. In this case, a lower surface of the via 230 may correspond to a lower surface of the second via part 232. The second width W2 of the lower surface of the via 230 may be 70 μm to 150 μm. For example, the second width W2 of the lower surface of the via 230 may be 80 μm to 130 μm. For example, the second width W2 of the lower surface of the via 230 may be 90 μm to 120 μm.

That is, the upper surface and the lower surface of the via 230 in the embodiment may have the same width. For example, the first width W1 may be the same as the second width W2.

Meanwhile, a central portion of the via 230 in the embodiment may have a third width W3. In this case, a width of the central portion of the via 230 may mean a width at the position where the third inflection portion of the third via part 233 is formed.

The third width W3 of the central portion of the via 230 may be equal to or greater than the first width W1 and the second width W2. For example, the third width W3 of the central portion of the via 230 may be 70 μm to 200 μm. For example, the third width W3 of the central portion of the via 230 may be 80 μm to 180 μm. For example, the third width W3 of the central portion of the via 230 may be 90 μm to 170 μm.

As described above, the third width W3 of the central portion of the via 230 in the embodiment is equal to or greater than the width of the upper surface or the width of the lower surface of the via 230. Accordingly, the embodiment can solve a void problem that may occur in the process of forming the via 230, thereby improving reliability.

FIG. 12 is a view showing a circuit board according to a third embodiment.

Referring to FIG. 12, an insulating layer 310 of the circuit board according to the third embodiment may include a first insulating layer 311, a second insulating layer 312, and an adhesive layer 313. In addition, the circuit board according to the third embodiment may include via holes passing through upper and lower surfaces of the insulating layer 310 in a thickness direction. In addition, a via 330 may be formed in the via hole.

In addition, the circuit board may include a circuit pattern 320 disposed on the insulating layer 310 and connected to an upper surface and/or a lower surface of the via 330.

At this time, the via of the three parts of the first and second embodiments were formed in one insulating layer. In contrast, one via part is formed in each of the three insulating layers of the third embodiment, and accordingly, one via may be finally formed by combining the three parts.

The first and second insulating layers 311 and 312 may be CCL. Each of the first and second insulating layers 311 and 312 may be impregnated with the same content of glass fibers in an entire region.

In addition, the adhesive layer 313 may not contain glass fibers therein.

Accordingly, hourglass-shaped via parts may be formed in the first and second insulating layers 311 and 312, respectively.

That is, the first via part 331 having an hourglass shape may be formed in the first insulating layer 311.

Also, a second via part 332 having an hourglass shape may be formed in the second insulating layer 312.

Also, a third via part 333 having a rectangular shape may be formed in the adhesive layer 313.

An upper width of the third via part 333 may have the same as a lower width of the third via part.

In this case, the upper width or lower width of the third via part 333 may be equal to or greater than an upper width of the first via part 331 or a lower width of the second via part 332.

That is, the circuit board according to the third embodiment may include one via formed using a plurality of insulating layers, and thus the via part formed in each insulating layer may be formed.

According to an embodiment, a via is provided with at least two or more inflection portions on a side surface. Specifically, the via includes a first via part disposed in a first region of the insulating layer, a second via part disposed in a second region of the via, and a third via part disposed in a third region between the first and second regions. In this case, the first via part may have a shape in which the width gradually decreases from an upper surface to a lower surface. In addition, the second via part may have a shape in which a width gradually increases from an upper surface to a lower surface. In addition, the third via part may have a inflection portion between an upper surface and a lower surface. In addition, a width of the third via part may gradually increase from an upper surface toward the inflection portion. In addition, a width of the third via part may gradually decrease from the inflection portion toward a lower surface. According to the via of the embodiment, a width of a central region (third via part) of the via may be greater than or equal to a width of an upper region (first via part) and a lower region (second via part).

Accordingly, the embodiment may solve a plating clogging phenomenon due to the completion of plating in the central region before an upper region or a lower region in a via plating process. In addition, the embodiment can solve the void problem by changing the shape of the via, thereby minimizing the open defect caused by the via crack. In addition, the embodiment provides a via capable of securing reliability even in a high temperature and high humidity environment, thereby improving user satisfaction.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

What is claimed is:

1. A circuit board comprising: an insulating layer including an upper surface and a lower surface, where the insulating layer includes a via hole passing through at least a partial region of the insulating layer in a thickness direction, wherein the via hole includes: a first via part adjacent to the upper surface and having an inclination angle of which a width decreases toward the lower surface of the insulating layer; a second via part adjacent to the lower surface and having an inclination angle of which a width decreases toward the upper surface of the insulating layer; and a third via part disposed between the first via part and the second via part and having an inclination angle different from the inclination angle of the first via part and the inclination angle of the second via part, wherein the third via part includes: a first sub part adjacent to the first via part and having an inclination angle of which a width increase toward the lower surface of the insulating layer; and a second sub part adjacent to the second via part and having an inclination angle of which a width decrease toward the lower surface of the insulating layer, wherein the via hole includes a first inflection portion between the first via part and the first sub part of the third via part; a second inflection portion between the second via part and the second sub part of the third via part; and a third inflection portion between the first sub part and the second sub part of the third via part; wherein a width of the via hole increases from the first inflection portion toward the third inflection portion, wherein a width of the via hole decreases from the third inflection portion toward the second inflection portion.

2. The circuit board of claim 1, wherein the thickness direction is a direction from the upper surface to the lower surface of the insulating layer or a direction from the lower surface to the upper surface of the insulating layer, wherein a width of the first via part gradually decreases from the upper surface of the insulating layer toward the lower surface of the insulating layer, and where a width of the second via part gradually decreases from the lower surface of the insulating layer toward the upper surface of the insulating layer.

3. The circuit board of claim 2, wherein the first via part includes a first portion adjacent to the third via part and having a smallest width; wherein the second via part includes a second portion adjacent to the third via part and having a smallest width, and wherein a central portion of the third via part in the thickness direction has a width greater than a width of each of the first portion and the second portion.

4. The circuit board of claim 3, wherein a maximum width of the central portion of the third via part is equal to or greater than a width of the first portion of the first via part or a width of the second portion of the second via part.

5. The circuit board of claim 1, wherein the insulating layer is provided as a single layer, and wherein the via hole passes through the upper and lower surfaces of the insulating layer of the single layer.

6. The circuit board of claim 5, wherein the insulating layer of the single layer includes: a first region corresponding to the first via part and including glass fibers of a first content; a second region corresponding to the second via part and including glass fibers of a second content; and a third region corresponding to the third via part and including glass fibers having a third content smaller than the first and second content.

7. The circuit board of claim 6, wherein the first and second regions of the insulating layer include a resin impregnated with glass fibers, and wherein the third region of the insulating layer includes only a resin.

8. The circuit board of claim 5, wherein the third via part of the via hole does not overlap the glass fibers of the insulating layer in a horizontal direction.

9. The circuit board of claim 1, further comprising: a through electrode disposed in the via hole.

10. The circuit board of claim 9, further comprising: a circuit pattern disposed on the through electrode; and wherein a width of the circuit pattern is greater than a width of the through electrode.

11. The circuit board of claim 3, wherein the via hole has a greatest width in the central portion of the third via part.

12. The circuit board of claim 1, wherein a side surface of the third via part has a curved surface convex toward an outer side of the insulating layer.

13. The circuit board of claim 1, wherein the inclination angles of the first via part and the second via part are inclined in different directions.

14. The circuit board of claim 13, wherein the inclination angle of the first sub part is inclined in the same direction as the inclination angle of the second via part; and wherein the inclination angle of the second sub part is inclined m the same direction as the inclination angle of the first via part.

15. The circuit board of claim 1, wherein the third via part includes: a third sub part disposed between the first sub part and the second sub part and having an inclination angle different from the inclination angles of the first and second sub parts.

16. The circuit board of claim 15, wherein a width of the third sub part does not change toward the lower surface of the insulating layer.

* * * * *